US008212613B1

(12) United States Patent
Hsieh

(10) Patent No.: US 8,212,613 B1
(45) Date of Patent: Jul. 3, 2012

(54) SWITCHING AMPLIFIER USING FLYBACK TRANSFORMER

(76) Inventor: Wen-Hsiung Hsieh, Keelung (TW)

( * ) Notice: Subject to any disclaimer, the term of this patent is extended or adjusted under 35 U.S.C. 154(b) by 0 days.

(21) Appl. No.: 13/237,979

(22) Filed: Sep. 21, 2011

(51) Int. Cl.
H03F 3/38 (2006.01)
(52) U.S. Cl. ............... 330/10; 330/251; 330/207 A
(58) Field of Classification Search ............... 330/10, 330/251, 207 A
See application file for complete search history.

(56) References Cited

U.S. PATENT DOCUMENTS

| 3,629,616 | A | 12/1971 | Walker |
| 4,531,096 | A | 7/1985 | Yokoyama |
| 5,014,016 | A | 5/1991 | Anderson |
| 5,115,205 | A | 5/1992 | Holmes, Jr. |
| 5,160,896 | A | 11/1992 | Mccorkle |
| 5,767,740 | A | 6/1998 | Fogg |
| 5,805,020 | A | 9/1998 | Danz |
| 5,841,643 | A * | 11/1998 | Schenkel ............... 363/21.13 |
| 5,949,282 | A | 9/1999 | Nguyen |
| 6,011,345 | A * | 1/2000 | Murray et al. ............ 310/321 |
| 6,252,784 | B1 * | 6/2001 | Dobrenko ............... 363/21.12 |
| 6,356,151 | B1 | 3/2002 | Nalbant |
| 6,496,059 | B1 * | 12/2002 | Nguyen .................. 330/10 |
| 6,563,377 | B2 | 5/2003 | Butler |
| 6,794,932 | B1 | 9/2004 | Butler |
| 6,922,101 | B2 | 7/2005 | Bayko |
| 7,286,008 | B2 | 10/2007 | Watts |
| 7,400,191 | B2 | 7/2008 | Rodriguez |
| 7,816,985 | B2 | 10/2010 | Attwood et al. |
| 7,940,535 | B2 * | 5/2011 | Itoh et al. ............... 363/21.12 |
| 7,952,426 | B2 | 5/2011 | Mun |
| 2008/0136350 | A1* | 6/2008 | Tripathi et al. ........... 315/294 |
| 2011/0110129 | A1* | 5/2011 | Busch ..................... 363/53 |

* cited by examiner

Primary Examiner — Patricia Nguyen

(57) ABSTRACT

A switching amplifying method or a switching amplifier for obtaining one or more than one linearly amplified replicas of an input signal, is highly efficient, and does not have the disadvantage of "dead time" problem related to the class D amplifiers. Another aspect of the present invention provides a switching amplifier that is completely off when there is no input signal. Yet another aspect of the present invention provides a switching amplifier for obtaining a plurality of different linearly amplified replicas of the input signal, and adds more slave outputs easily and economically.

20 Claims, 11 Drawing Sheets

SWITCHING AMPLIFIER USING FLYBACK TRANSFORMER

BACKGROUND OF THE INVENTION (1) Field of the Invention

This invention is related in general to a power amplifier, and more particularly, to a switching amplifier that can efficiently and linearly amplify an input signal having first and second polarities for obtaining one or more than one low-distortion output signals.

(2) Description of the Related Art

Amplifiers are electronic devices which are used for increasing the power of a signal, and are generally categorized into various classes. The popular amplifiers include class A, class B and class D amplifiers. Reference is made to the exemplary U.S. Patents that disclose various types of amplifiers: U.S. Pat. Nos. 7,952,426; 7,816,985; 7,400,191; 7,286,008; 6,922,101; 6,794,932; 6,563,377; 6,356,151; 6,282,747; 5,949,282; 5,805,020; 5,767,740; 5,160,896; 5,115,205; 5,014,016; 4,531,096 and 3,629,616.

In general, class A amplifiers produce a linearly amplified replica of an input signal, but are inefficient in terms of power usage because the amplifying elements are always biased and conducting, even if there is no input.

Class B amplifiers only amplify half of the input wave cycle, thus creating a large amount of distortion, but their efficiency is greatly improved and is much better than class A. A practical circuit using class B elements is the push-pull stage, such as the very simplified complementary pair arrangement. Complementary or quasi-complementary devices are each used for amplifying the opposite halves of the input signal, which is then recombined at the output. This arrangement gives excellent efficiency, but can suffer from the drawback that there is a small mismatch in the cross-over region—at the "joins" between the two halves of the signal, as one output device has to take over supplying power exactly as the other finishes. This is called crossover distortion.

In a class D amplifier an input signal is converted to a sequence of higher voltage output pulses. The averaged-over-time power values of these pulses are directly proportional to the instantaneous amplitude of the input signal. The frequency of the output pulses is typically ten or more times the highest frequency in the input signal to be amplified. The output pulses contain inaccurate spectral components (that is, the pulse frequency and its harmonics) which must be removed by a low-pass passive filter. The resulting filtered signal is then a linearly amplified replica of the input.

The main advantage of a class D amplifier is power efficiency. Because the output pulses have fixed amplitude, the switching elements are switched either completely on or completely off, rather than operated in linear mode.

However, one significant challenge for a driver circuit in class D amplifiers is keeping dead times as short as possible. "Dead time" is the period during a switching transition when both output MOSFETs are driven into Cut-Off Mode and both are "off". Dead times need to be as short as possible to maintain an accurate low-distortion output signal, but dead times that are too short cause the MOSFET that is switching on to start conducting before the MOSFET that is switching off has stopped conducting. The MOSFETs effectively short the output power supply through themselves, a condition known as "shoot-through". Driver failures that allow shoot-through result in excessive losses and sometimes catastrophic failure of the MOSFETs.

Therefore, the main disadvantage of a class D amplifier is having the "dead time" problem to cause the distortion of the output signal.

In summary, class A amplifiers produce a linearly amplified replica of an input signal, but are inefficient in terms of power usage. The push-pull class B amplifiers provide excellent efficiency (compared to class A amplifiers), but introduce crossover distortion. Class D amplifiers are most efficient compared to class A and class B amplifiers, but there is one significant problem for MOSFET driver circuits in class D amplifiers: the "dead time" that cause the distortion of the output signal.

Accordingly, in light of current state of the art and the drawbacks to current amplifiers mentioned above. A need exits for a switching amplifier that would continue to be highly efficient, that would efficiently and linearly amplify an input signal for generating low-distortion output signals.

SUMMARY OF THE INVENTION

The present invention discloses a switching amplifier that produces one or more than one linearly amplified replicas of an input signal, is highly efficient, and does not have the "dead time" problem related to class D amplifiers.

One aspect of the present invention provides a method of obtaining one or more than one output signals from a direct current (DC) voltage, wherein the output signals are linearly amplified replicas of an input signal, comprising the steps of: receiving the input signal; transforming and pulse modulating the input signal for generating a pulse modulated signal, wherein the transforming is according to that when applying the direct current (DC) voltage across a primary winding of a flyback transformer, the energy stored in the primary winding is proportional to square of the applying time, wherein the flyback transformer further comprises one or more than one secondary windings that each secondary winding is for generating a corresponding output signal; switching a current in the primary winding from the direct current (DC) voltage according to the pulse modulated signal; generating the output signals comprising the following steps for each output signal from its corresponding secondary winding: blocking a current in the corresponding secondary winding when the current in the primary winding is switched on and conducting the current when the current in the primary winding is switched off for generating a pulsed output signal; filtering the pulsed output signal for outputting the output signal.

Another aspect of the present invention provides a method of obtaining one or more than one output signals from a direct current (DC) voltage, wherein the output signals are linearly amplified replicas of an input signal having first and second polarities, comprising the steps of: receiving the input signal; transforming the input signal for generating a discrete time peak current signal, wherein said transforming is according to that when applying the direct current (DC) voltage across a primary winding of a flyback transformer, the energy stored in the primary winding is proportional to square of the peak current of the primary winding, wherein the flyback transformer further comprises one or more than one secondary windings that each secondary winding is for generating a corresponding output signal; switching a current in the primary winding from the direct current (DC) voltage and getting a feedback current signal by detecting the current of the primary winding, wherein said switching is according to the discrete time peak current signal and the feedback current signal; generating the output signals comprising the following steps for each output signal from its corresponding secondary winding when the current in the primary winding is switched on and conducting the current when the current in the primary winding is switched off for generating a pulsed output signal; filtering the pulsed output signal for outputting the output signal.

Yet another aspect of the present invention provides a switching amplifier further comprising one or more than one slave outputs.

Yet another aspect of the present invention provides a switching amplifier further comprising a negative feedback signal generator to generate a negative feedback signal corresponding to the output signal, wherein the amplifier control unit integrates the input signal and the negative feedback signal to process a negative feedback control.

Yet another aspect of the present invention provides a switching amplifier further comprising a rectifying and smoothing unit to rectify and smooth an alternating current (AC) voltage and to provide the direct current (DC) voltage.

From the switching amplifier in accordance with the present invention, one aspect of the present invention provides a switching amplifier that is highly efficient and without the "dead time" problem related to the class D amplifiers.

From the switching amplifier in accordance with the present invention, another aspect of the present invention provides a switching amplifier that is completely off when there is no input signal.

From the switching amplifier in accordance with the present invention, yet another aspect of the present invention provides a switching amplifier that isolates the outputs from the power supply.

From the switching amplifiers in accordance with the present invention, yet another aspect of the present invention provides a switching amplifier for obtaining a plurality of different linearly amplified replicas of the input signal efficiently, and adds more outputs easily and economically.

From the switching amplifier in accordance with the present invention, yet another aspect of the present invention provides a switching amplifier which comprised of an act of comparing an input signal with an output feedback signal for detection and correction of overall system signal processes therefore does not require a power supply regulator and is substantially immune to power supply and load perturbations.

From the switching amplifiers in accordance with the present invention, yet another aspect of the present invention provides a switching amplifier with a negative feedback control that slave output signals trends to track an output signal for the direct current (DC) voltage and load changes for obtaining multiple output signals are substantially immune to power supply and load perturbations.

BRIEF DESCRIPTION OF THE DRAWINGS

The above and other features and advantages of the present general inventive concept will become more apparent by describing in detail exemplary embodiments thereof with reference to the attached drawings in which.

DETAILED DESCRIPTION OF THE PREFERRED EMBODIMENTS

The detailed description set forth below in connection with the appended drawings is intended as a description of presently preferred embodiments of the invention and is not intended to represent the only forms in which the present invention may be constructed and or utilized.

Figure 1:
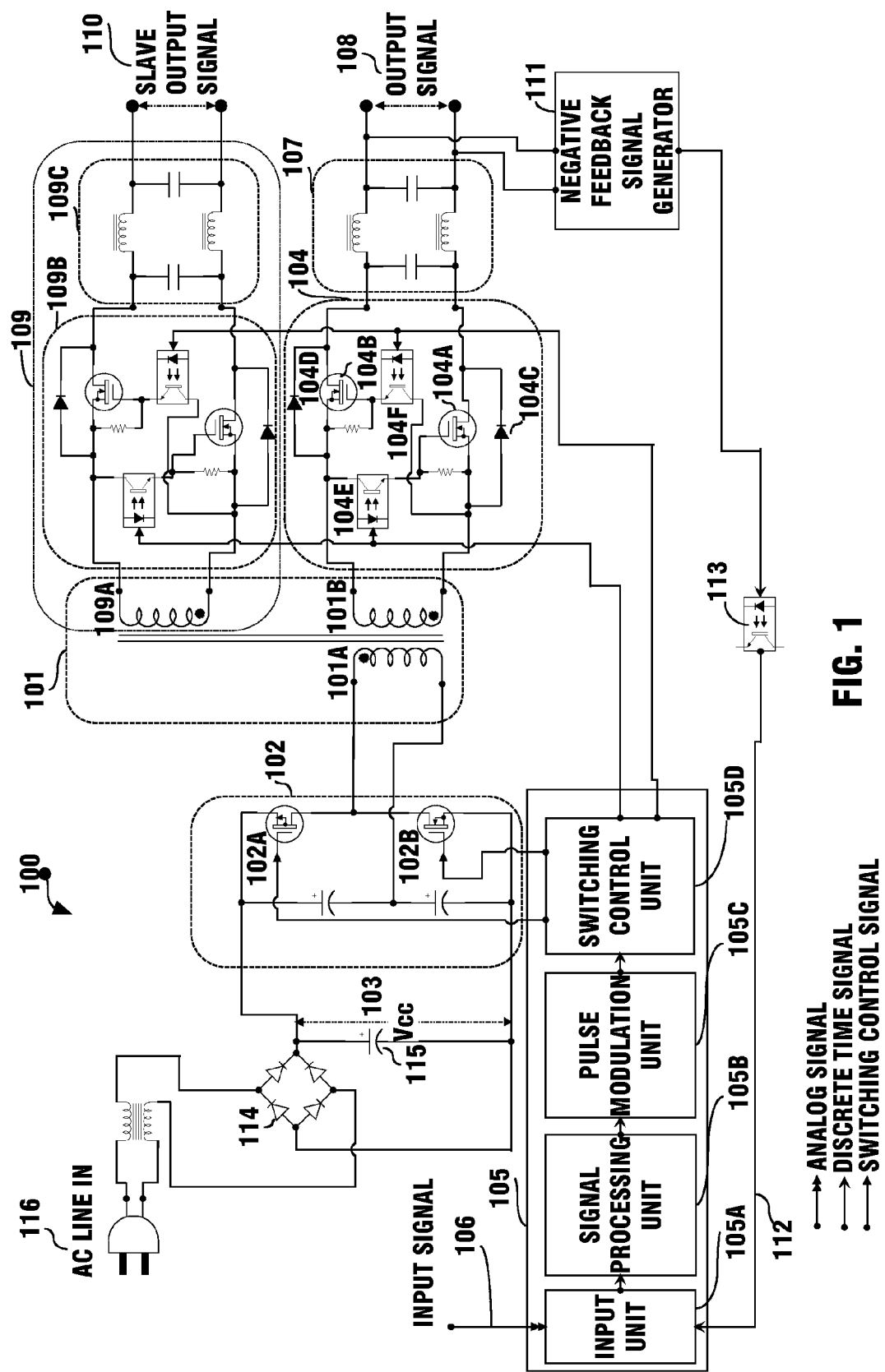
FIG. 1 is an exemplary block and circuit diagram illustrating an embodiment of a switching amplifier in accordance with the first method of present invention, wherein the switching amplifier having switches configured as a half bridge topology.

FIG. 1 is an exemplary block and circuit diagram illustrating an embodiment of a switching amplifier 100 in accordance with the first method of present invention, wherein the switching amplifier 100 having switches 102A and 102B configured as a half bridge topology.

As illustrated in FIG. 1, the switching amplifier 100 of the present invention for amplifying an input signal 106 having positive and negative polarities is comprised of: a transformer 101 comprising a primary winding 101A and a secondary winding 101B magnetically coupled to the primary winding 101A; a switching unit 102 comprising two switches 102A and 102B configured as a half bridge topology coupled to the primary winding 101A for switching a current in the primary winding 101A from a direct current (DC) voltage 103; a controllable diodes unit 104 coupled to the secondary winding 101B wherein the controllable diodes unit 104 comprises of two switches 104A and 104B and two diode means 104C and 104D; an amplifier control unit 105 for receiving the input signal 106 and coupled to the switches 102A and 102B of the switching unit 102 and the switches 104A and 104B of the controllable diodes unit 104 through photo couplers 104E and 104F respectively for controlling their switching; a filter unit 107 coupled to the controllable diodes unit 104 and outputting the output signal 108.

In this non-limiting exemplary embodiment, the input signal 106 is an analog signal. And it is obvious for a corresponding embodiment of a switching amplifier in accordance with this invention if the input signal is a discrete time signal.

As further illustrated in FIG. 1, the transformer 101 is a flyback transformer operated in discontinuous mode. Accordingly, when the current in the primary winding 101A is switched on, the current in the secondary winding 101B is blocked by the controllable diodes unit 104. Therefore, during this switched on period, the primary winding acts like a pure inductor and the current in the primary winding 101A builds up linearly in it from zero to a peak value. Further, when the current in the primary winding 101A is switched off, the current in the secondary winding 101B is conducted by the controllable diodes unit 104 for delivering previously stored energy to the filter unit 107.

Therefore, during the period when the current in the primary winding 101A is switched on, the direct current (DC) voltage 103 is applied across the primary winding 101A, and the current in the primary winding 101A builds up linearly from zero to a peak value which is proportional to the switched on period. Therefore, during the switched on period, the energy stored in the primary winding 101A is according to the equation:

$$E = \frac{L_p(I_p)^2}{2}$$

wherein E is the energy stored in the primary winding 101A, $L_p$ is the inductance of the primary winding 101A, and $I_p$ is the peak value of the current in the primary winding 101A at the end of the switched on period. Since the peak value $I_p$ is proportional to the switched on period $T_{on}$:

$$I_p \propto T_{on} ==> E \propto (T_{on})^2$$

Therefore, the energy stored into the primary winding 101A during a switched on period is proportional to the square of the switched on period.

As further illustrated in FIG. 1, the amplifier control unit 105 comprises an input unit 105A for receiving the input signal 106 and having an analog to digital converter for converting the input signal 106 to a discrete time input signal x[n]

$$x = \{x[n]\},\ 0 < n < \infty;$$

a signal processing unit 105B for transforming the discrete time input signal x[n] to a transformed signal y[n] according to the following equation:

$$y[n] = {}^2\sqrt{x[n]},\ 0 < n < \infty;$$

a pulse modulation unit 105C for getting a pulse modulated signal from pulse modulating the transformed signal y[n] from the signal processing unit 105B; and a switching control unit 105D coupled to the switches 102A and 102B of the switching unit 102 and the switches 104A and 104B of the controllable diodes unit 104 to control their switching according to the pulse modulated signal from the pulse modulation unit 105C.

Figure 2:
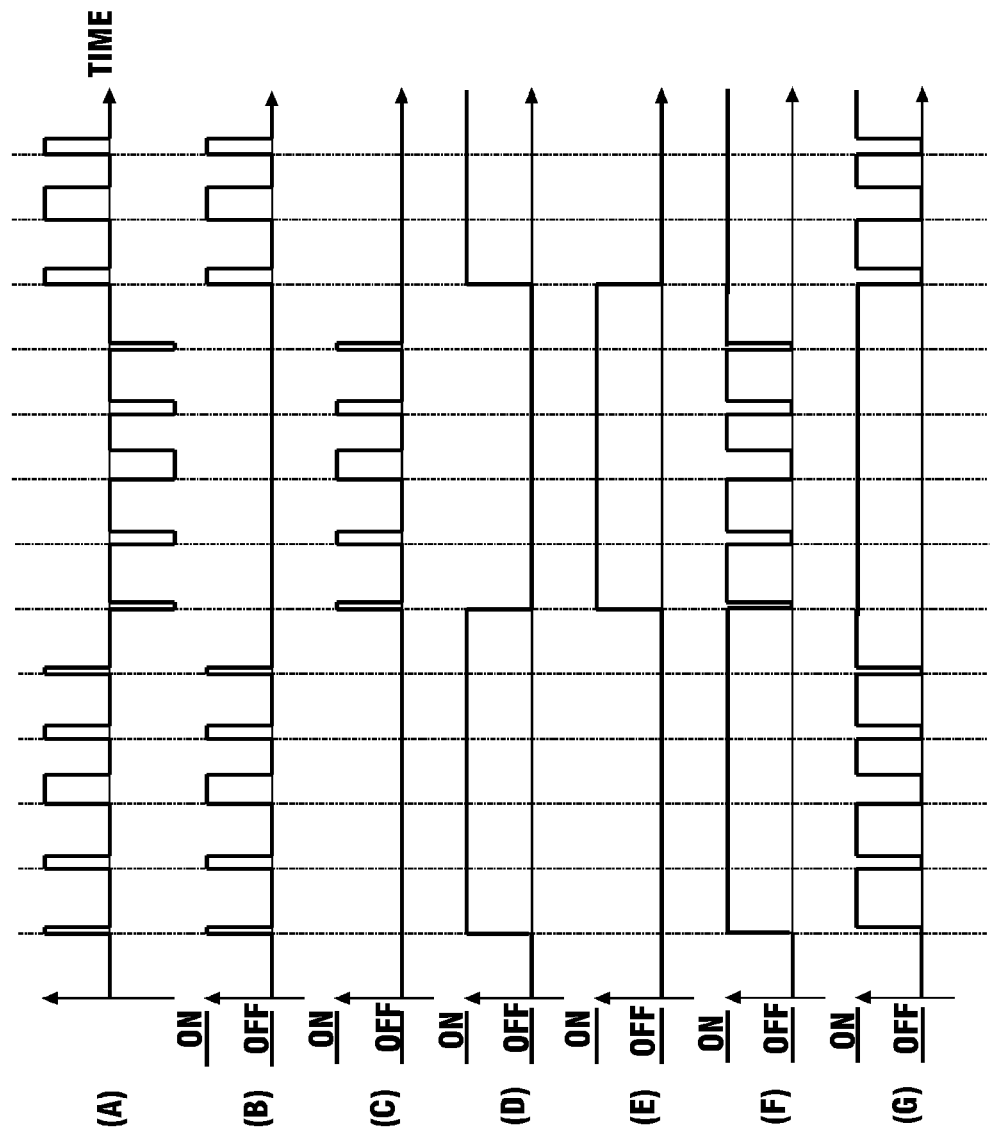
FIG. 2 are exemplary waveform diagrams illustrating the various waveforms at input and output points of a switching control unit of various figures in accordance with the present invention.

FIG. 2 are exemplary waveform diagrams illustrating the various waveforms at input and output points of switching control units in the circuits of various figures in accordance with the present invention.

As illustrated in FIG. 2, a non-limiting exemplary waveform for the pulse modulated signal from the pulse modulation unit 105C is illustrated in FIG. 2(A), since the input signal 106 has first and second polarities; therefore, the pulse modulated signal also has first and second polarities. According to the pulse modulated signal illustrated in FIG. 2(A), non-limiting exemplary waveforms of switching control signals from the switching control unit 105D to the switches 102A and 102B for controlling their switching are illustrated in FIG. 2(B) and FIG. 2(C), respectively. Also according to the pulse modulated signal illustrated in FIG. 2(A), non-limiting exemplary waveforms of switching control signals from the switching control unit 105D to the switches 104A and 104B are illustrated in FIG. 2(D) and FIG. 2(E), respectively.

Accordingly, as illustrated in FIG. 1 and FIG. 2, when the input signal 106 is zero, the switches 102A and 102B in the switching unit 102 and the switches 104A and 104B in the controllable diodes unit 104 are all switched off. When the input signal 106 is not zero, the switches 102A and 102B switch a current in the primary winding 101A from a direct current (DC) voltage 103 according to the pulse modulated signal transformed and pulse modulated from the input signal 106, and the switches 104A and 104B switch for blocking the current in the secondary winding 101B when the current in the primary winding 101A is switched on by the switching unit 102, and conducting the current in the secondary winding 101B when the current in the primary winding 101A is switched off.

As further illustrated in FIG. 1, the filter unit 107 is a low pass filter to obtain the output signal 108 corresponding to the input signal 106 by filtering the output of the controllable diodes unit 104 and outputting the output signal 108.

As further illustrated in FIG. 1, the switching amplifier 100 further comprising one slave output unit 109 or more than one slave output units, although more than one slave output units are not shown in FIG. 1 but are obvious from said one slave output unit 109, wherein the slave output unit 109 comprises: the transformer 101 further comprising a slave secondary winding 109A; a slave controllable diodes unit 109B coupled to the slave secondary winding 109A for blocking a current in the slave secondary winding 109A when the current in the primary winding 101A is switched on by the switching unit, and conducting the current in the slave secondary winding 109A when the current in the primary winding is switched off; a slave filter unit 109C to obtain a slave output signal 110 corresponding to the input signal by filtering the output of the slave controllable diodes unit 109B and outputting the slave output signal 110.

As further illustrated in FIG. 1, the amplifying gain of the output signal 108 is according to the turn ratio between the primary winding 101A and the secondary winding 101B; and the amplifying gain of the slave output signal 110 is according to the turn ratio between the primary winding 101A and the slave secondary winding 109A. Therefore, it is easy for the switching amplifier 100 to obtain a plurality of output signals with different amplifying gains.

As further illustrated in FIG. 1, the switching amplifier 100 further comprises a negative feedback signal generator 111 to generate a negative feedback signal corresponding to the output signal 112, wherein the amplifier control unit 105 integrates the input signal 106 and the negative feedback signal 112.

Figure 3:
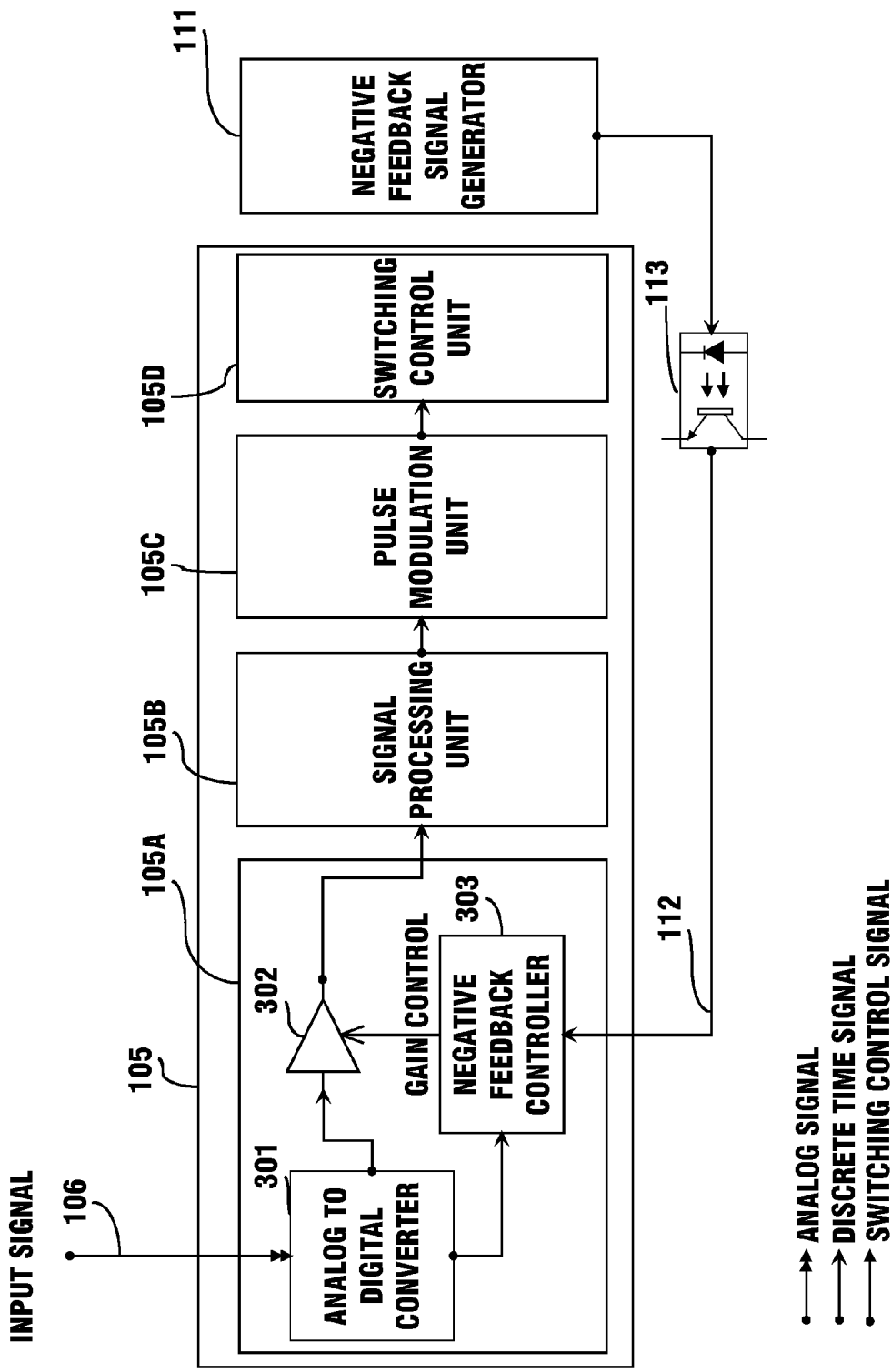
FIG. 3 is an exemplary block and circuit diagram illustrating an embodiment of the amplifier control unit integrating an input signal and a negative feedback signal in FIGS. 1, 4 and 5 in accordance with the present invention.
Figure 4:
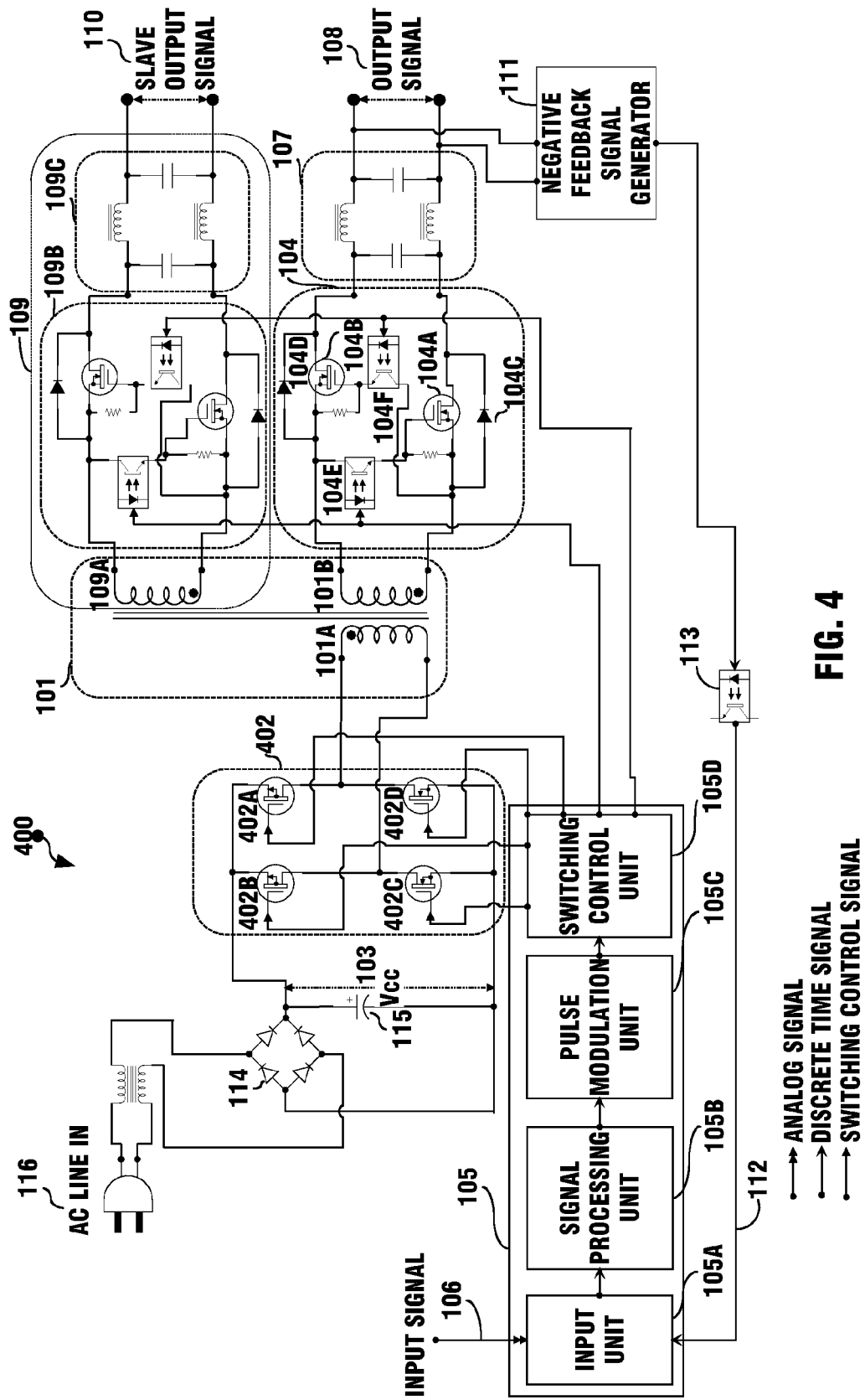
FIG. 4 is an exemplary block and circuit diagram illustrating an embodiment of a switching amplifier in accordance with the first method of present invention, wherein the switching amplifier having switches configured as a full bridge topology.
Figure 5:
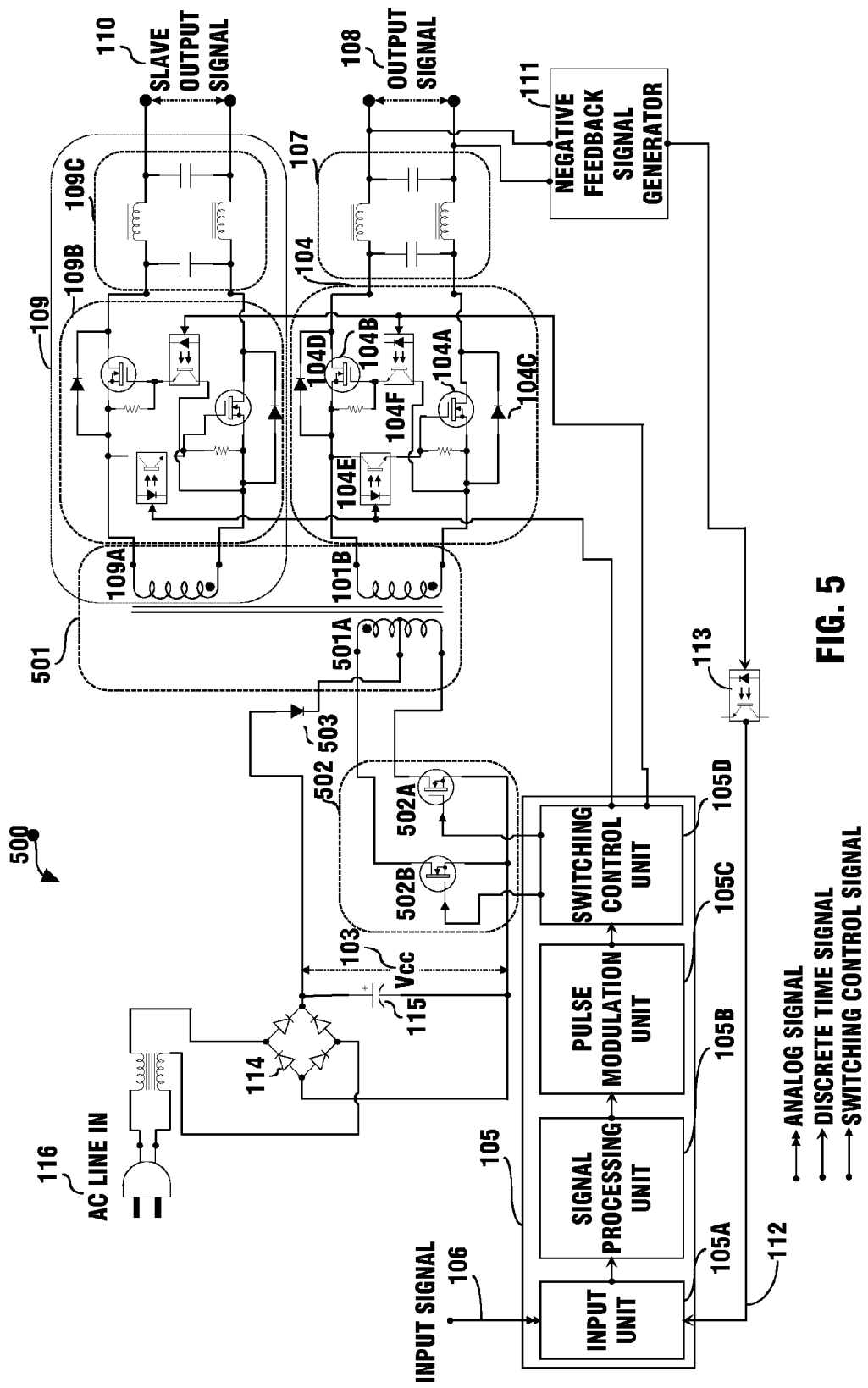
FIG. 5 is an exemplary block and circuit diagram illustrating an embodiment of a switching amplifier in accordance with the first method of present invention, wherein the switching amplifier having switches configured as a push pull topology.

FIG. 3 is an exemplary block and circuit diagram illustrating an embodiment of the amplifier control unit 105 integrating the input signal 106 and a negative feedback signal 112 in FIGS. 1, 4 and 5 in accordance with the present invention.

As illustrated in FIG. 3 and FIG. 1, the input unit 105A has an analog to digital converter 301 and further comprises a linear digital transformer 302 and a negative feedback controller 303. Wherein the analog to digital converter 301 receives the input signal 106 and converts the input signal 106 to a discrete time input signal:

$$x=\{x[n]\},\ 0<n<\infty;$$

The linear digital transformer 302 transforms the discrete time input signal x[n] by multiplying a gain G to the discrete time input signal (the default value of the gain G is 1):

$$X[n]=\{G\times x[n]\},\ 0<n<\infty$$

to get a compensated discrete time signal X[n] and sends the compensated discrete time signal X[n] to the signal processing unit 105B.

Accordingly, for the switching amplifier 100 further comprises a negative feedback signal generator 111 to generate a negative feedback signal corresponding to the output signal 112 and the amplifier control unit 105 integrates the input signal 106 and the negative feedback signal 112, the signal processing unit 105B receives the compensated discrete time signal X[n], and the output of the signal processing unit 105B is:

$$y[n]=\sqrt[2]{X[n]},\ 0<n<\infty.$$

As further illustrated in FIG. 3, the negative feedback controller 303 receives discrete time input signal from the analog to digital converter 301 and compares it to the negative feedback signal 112, and adjust the gain G of the linear digital transformer 302 according to the comparison. For example, if the negative feedback signal 112 corresponding to the output signal 108 shows that the output signal 108 is below a required level, then the negative feedback controller 303 will increase the gain G of the linear digital transformer 302 to increase the output signal 108, wherein said required level is obtained according to the discrete time input signal.

As further illustrated in FIG. 1, the amplifier control unit 105 of the switching amplifier 100 integrates the input signal 106 and the negative feedback signal 112 to process a negative feedback control. Accordingly, with the negative feedback control, the slave output signal 110 trends to track the output signal 108 for the direct current (DC) voltage 103 and load changes. Therefore, the switching amplifier 100 provides multiple output signals are substantially immune to power supply and load perturbations.

As further illustrated in FIG. 1, the switching amplifier 100 further comprises a photo coupler 113 coupled between the negative feedback signal generator 111 and the amplifier control unit 105 to provide electric isolation between the negative feedback signal generator 111 and the amplifier control unit 105.

As further illustrated in FIG. 1, the switching amplifier 100 further comprises a rectifying unit 114 and a smoothing unit 115 to rectify and smooth an alternating current (AC) voltage 116 and to provide the direct current (DC) voltage 103, wherein the rectifying unit 114 is a full bridge rectifier and the smoothing unit 115 is a capacitor.

FIG. 4 is an exemplary block and circuit diagram illustrating an embodiment of a switching amplifier 400 in accordance with the first method of present invention, wherein the switching amplifier 400 having switches 402A, 402B, 402C and 402D configured as a full bridge topology.

As illustrated in FIG. 4, the switching amplifier 400 of the present invention for amplifying an input signal 106 having positive and negative polarities is comprised of: a transformer 101 comprising a primary winding 101A and a secondary winding 101B magnetically coupled to the primary winding 101A; a switching unit 402 comprising four switches 402A, 402B, 402C and 402D configured as a full bridge topology coupled to the primary winding 101A for switching a current in the primary winding 101A from a direct current (DC) voltage 103; a controllable diodes unit 104 coupled to the secondary winding 101B; an amplifier control unit 105 for receiving the input signal 106 and coupled to the switches 402A, 402B, 402C and 402D of the switching unit 402 and the switches 104A and 104B of the controllable diodes unit 104 through photo couplers 104E and 104F respectively for controlling their switching; a filter unit 107 coupled to the controllable diodes unit 104.

As further illustrated in FIG. 4, the amplifier control unit 105 comprises an input unit 105A for receiving the input signal 106 and converting the input signal 106 to a discrete time input signal; a signal processing unit 105B for transforming the discrete time input signal and outputting a transformed signal, as previously illustrated in FIG. 1; a pulse modulation unit 105C for getting a pulse modulated signal from pulse modulating the transformed signal from the signal processing unit 105B; and a switching control unit 105D coupled to the switches 402A, 402B, 402C and 402D of the switching unit 402 and the switches 104A and 104B of the controllable diodes unit 104 to control their switching according to the pulse modulated signal from the pulse modulation unit 105C.

As illustrated in FIG. 4 and FIG. 2, a non-limiting exemplary waveform for the pulse modulated signal outputting from the pulse modulation unit 105C is illustrated in FIG. 2(A), since the input signal 106 has first and second polarities; therefore, the pulse modulated signal also has first and second polarities. According to the pulse modulated signal illustrated in FIG. 2(A), a non-limiting exemplary waveform of switching control signals from the switching control unit 105D to the switches 402A and 402C for controlling their switching are illustrated in FIG. 2(B); and a non-limiting exemplary waveform of switching control signals from the switching control unit 105D to the switches 402B and 402D for controlling their switching are illustrated in FIG. 2(C). Also according to the pulse modulated signal illustrated in FIG. 2(A), non-limiting exemplary waveforms of switching control signals from the switching control unit 105D to the switches 104A and 104B are illustrated in FIG. 2(D) and FIG. 2(E), respectively.

Accordingly, as illustrated in FIG. 4 and FIG. 2, when the input signal 106 is zero, the switches in the switching unit 402 and in the controllable diodes unit 104 are all switched off. When the input signal 106 is not zero, the switches 402A, 402B, 402C and 402D switch a current in the primary winding 101A from a direct current (DC) voltage 103 according to the pulse modulated signal transformed and pulse modulated from the input signal 106, and the switches 104A and 104B switch for blocking the current in the secondary winding 101B when the current in the primary winding 101A is switched on by the switching unit 402, and conducting the current in the secondary winding 101B when the current in the primary winding 101A is switched off.

As further illustrated in FIG. 4, the filter unit 107 is a low pass filter to obtain the output signal 108 corresponding to the input signal 106 by filtering the output of the controllable diodes unit 104 and outputting the output signal 108.

As further illustrated in FIG. 4, the switching amplifier 400 further comprising one slave output unit 109 or more than one slave output units, as previously illustrated in FIG. 1.

As further illustrated in FIG. 4, the switching amplifier 400 further comprises a negative feedback signal generator 111 to generate a negative feedback signal corresponding to the output signal 112, wherein the amplifier control unit 105 integrates the input signal 106 and the negative feedback signal 112.

As further illustrated in FIG. 4, the amplifier control unit 105 of the switching amplifier 400 integrates the input signal 106 and the negative feedback signal 112 to process a negative feedback control. Accordingly, with the negative feedback control, the slave output signal 110 trends to track the output signal 108 for the direct current (DC) voltage 103 and load changes. Therefore, the switching amplifier 400 provides multiple output signals are substantially immune to power supply and load perturbations.

As further illustrated in FIG. 4, the switching amplifier 400 further comprises a photo coupler 113 coupled between the negative feedback signal generator 111 and the amplifier control unit 105 to provide electric isolation between the negative feedback signal generator 111 and the amplifier control unit 105.

As further illustrated in FIG. 4, the switching amplifier 400 further comprises a rectifying unit 114 and a smoothing unit 115 to rectify and smooth an alternating current (AC) voltage 116 and to provide the direct current (DC) voltage 103.

FIG. 5 is an exemplary block and circuit diagram illustrating an embodiment of a switching amplifier 500 in accordance with the first method of present invention, wherein the switching amplifier 500 having switches 502A and 502B configured as a push pull topology.

As illustrated in FIG. 5, the switching amplifier 500 of the present invention for amplifying an input signal 106 having positive and negative polarities is comprised of: a transformer 501 comprising a primary winding 501A and a secondary winding 101B magnetically coupled to the primary winding 501A; a switching unit 502 comprising two switches 502A and 502B configured as a push pull topology coupled to the primary winding 501A for switching a current in the primary winding 501A from a direct current (DC) voltage 103; a diode 503 for preventing a current flow from the primary winding 501A to the direct current (DC) voltage 103; a controllable diodes unit 104 coupled to the secondary winding 101B; an amplifier control unit 105 for receiving the input signal 106 and coupled to the switches 502A and 502B of the switching unit 502 and the switches 104A and 104B of the controllable diodes unit 104 through photo couplers 104E and 104F respectively for controlling their switching; a filter unit 107 coupled to the controllable diodes unit 104.

As further illustrated in FIG. 5, the amplifier control unit 105 comprises an input unit 105A for receiving the input signal 106 and converting the input signal 106 to a discrete time input signal; a signal processing unit 105B for transforming the discrete time input signal and outputting a transformed signal, as previously illustrated in FIG. 1; a pulse modulation unit 105C for getting a pulse modulated signal from pulse modulating the transformed signal from the signal processing unit 105B; and a switching control unit 105D coupled to the switches 502A, and 502B of the switching unit 502 and the switches 104A and 104B of the controllable diodes unit 104 to control their switching according to the pulse modulated signal from the pulse modulation unit 105C.

As illustrated in FIG. 5 and FIG. 2, a non-limiting exemplary waveform for the pulse modulated signal outputting from the pulse modulation unit 105C is illustrated in FIG. 2(A), since the input signal 106 has first and second polarities; therefore, the pulse modulated signal also has first and second polarities. According to the pulse modulated signal illustrated in FIG. 2(A), non-limiting exemplary waveforms of switching control signals from the switching control unit 105D to the switches 502A and 502B for controlling their switching are illustrated in FIG. 2(B) and FIG. 2(C), respectively. Also according to the pulse modulated signal illustrated in FIG. 2(A), non-limiting exemplary waveforms of switching control signals from the switching control unit 105D to the switches 104A and 104B are illustrated in FIG. 2(D) and FIG. 2(E), respectively.

Accordingly, as illustrated in FIG. 5 and FIG. 2, when the input signal 106 is zero, the switches in the switching unit 502 and in the controllable diodes unit 104 are all switched off. When the input signal 106 is not zero, the switches 502A and 502B switch a current in the primary winding 501A from a direct current (DC) voltage 103 according to the pulse modulated signal transformed and pulse modulated from the input signal 106, and the switches 104A and 104B switch for blocking the current in the secondary winding 101B when the current in the primary winding 501A is switched on by the switching unit 502, and conducting the current in the secondary winding 101B when the current in the primary winding 501A is switched off.

As further illustrated in FIG. 5, the filter unit 107 is a low pass filter to obtain the output signal 108 corresponding to the input signal 106 by filtering the output of the controllable diodes unit 104 and outputting the output signal 108.

As further illustrated in FIG. 5, the switching amplifier 500 further comprising one slave output unit 109 or more than one slave output units, as previously illustrated in FIG. 1.

As further illustrated in FIG. 5, the switching amplifier 500 further comprises a negative feedback signal generator 111 to generate a negative feedback signal corresponding to the output signal 112, wherein the amplifier control unit 105 integrates the input signal 106 and the negative feedback signal 112.

As further illustrated in FIG. 5, the amplifier control unit 105 of the switching amplifier 500 integrates the input signal 106 and the negative feedback signal 112 to process a negative feedback control. Accordingly, with the negative feedback control, the slave output signal 110 trends to track the output signal 108 for the direct current (DC) voltage 103 and load changes. Therefore, the switching amplifier 500 provides multiple output signals are substantially immune to power supply and load perturbations.

As further illustrated in FIG. 5, the switching amplifier 500 further comprises a photo coupler 113 coupled between the negative feedback signal generator 111 and the amplifier control unit 105 to provide electric isolation between the negative feedback signal generator 111 and the amplifier control unit 105.

As further illustrated in FIG. 5, the switching amplifier 500 further comprises a rectifying unit 114 and a smoothing unit 115 to rectify and smooth an alternating current (AC) voltage 116 and to provide the direct current (DC) voltage 103.

Figure 6:
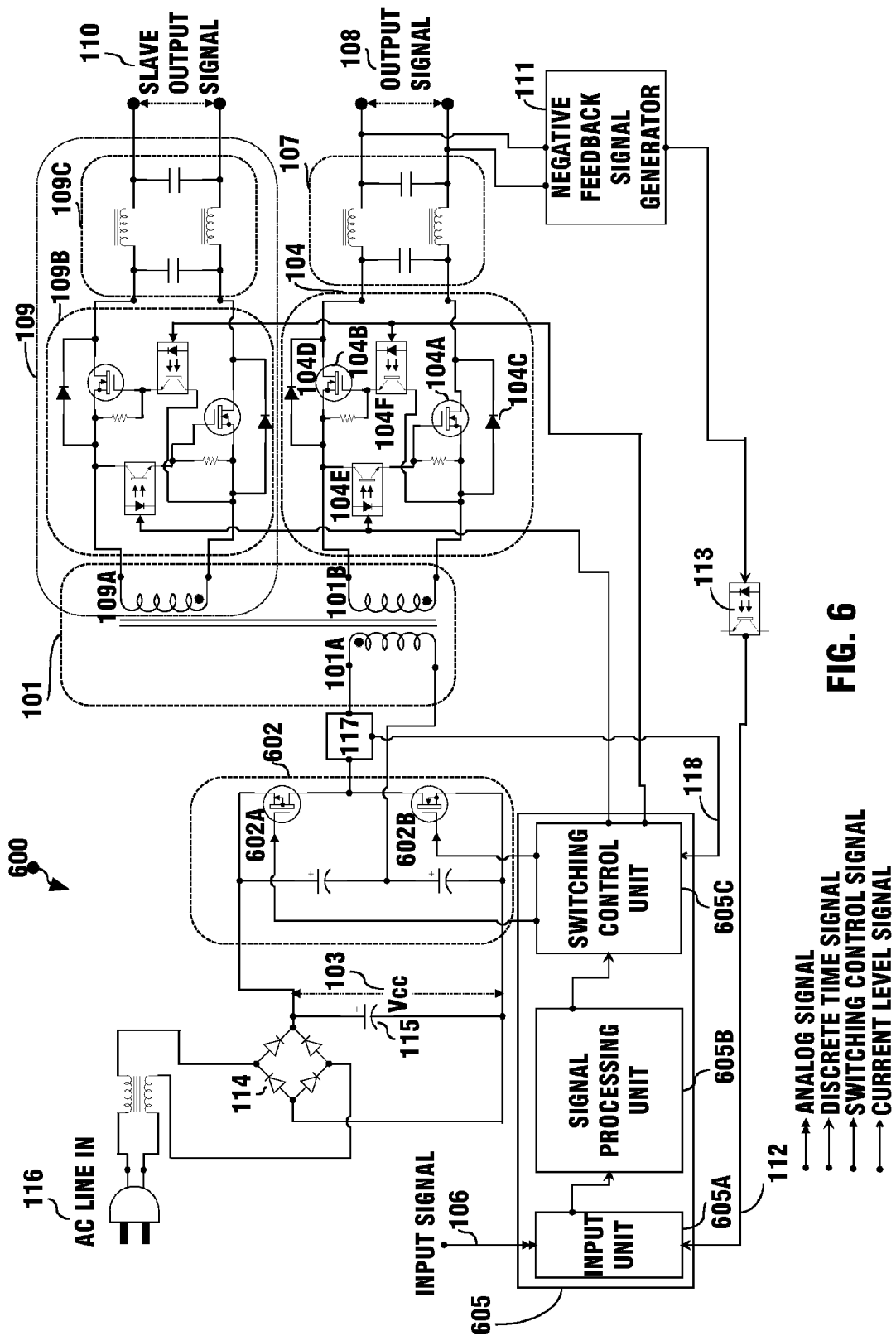
FIG. 6 is an exemplary block and circuit diagram illustrating an embodiment of a switching amplifier in accordance with the second method of present invention, wherein the switching amplifier having switches configured as a half bridge topology.

FIG. 6 is an exemplary block and circuit diagram illustrating an embodiment of a switching amplifier 600 in accordance with the second method of present invention, wherein the switching amplifier 600 having switches 602A and 602B configured as a half bridge topology.

As illustrated in FIG. 6, the switching amplifier 600 of the present invention for amplifying an input signal 106 having positive and negative polarities is comprised of: a transformer 101 comprising a primary winding 101A and a secondary winding 101B magnetically coupled to the primary winding 101A; a switching unit 602 comprising two switches 602A and 602B configured as a half bridge topology coupled to the primary winding 101A for switching a current in the primary winding 101A from a direct current (DC) voltage 103; a controllable diodes unit 104 coupled to the secondary winding 101B wherein the controllable diodes unit 104 comprises of two switches 104A and 104B and two diode means 104C and 104D; a negative feedback current signal generator 117 to generate a negative feedback current signal 118 corresponding to the current of the primary winding; an amplifier control unit 605 for receiving the input signal 106, the negative feedback current signal 118 and coupled to the switches 602A and 602B of the switching unit 602 and the switches 104A and 104B of the controllable diodes unit 104 through photo couplers 104E and 104F respectively for controlling their switching according to the input signal 106 and the negative feedback current signal 118; a filter unit 107 coupled to the controllable diodes unit 104 and outputting the output signal 108.

In this non-limiting exemplary embodiment, the input signal 106 is an analog signal. And it is obvious for a corresponding embodiment of a switching amplifier in accordance with this invention if the input signal is a discrete time signal.

As further illustrated in FIG. 6, the transformer 101 is a flyback transformer operated in discontinuous mode. Accordingly, when the current in the primary winding 101A is switched on, the current in the secondary winding 101B is blocked by the controllable diodes unit 104. Therefore, during this switched on period, the primary winding acts like a pure inductor and the current in the primary winding 101A builds up linearly in it from zero to a peak value. Further, when the current in the primary winding 101A is switched off, the current in the secondary winding 101B is conducted by the controllable diodes unit 104 for delivering previously stored energy to the filter unit 107.

Therefore, during the period when the current in the primary winding 101A is switched on, the direct current (DC) voltage 103 is applied across the primary winding 101A, and the current in the primary winding 101A builds up linearly from zero to a peak value which is proportional to the switched on period. Therefore, during the switched on period, the energy stored in the primary winding 101A is according to the equation:

$$E = \frac{L_p(I_p)^2}{2}$$

wherein E is the energy stored, $L_p$ is the inductance of the primary winding 101A, and $I_p$ is the peak value of the current at the end of the switched on period. Therefore, the energy stored into the primary winding 101A during a switched on period is proportional to the square of the peak current of the primary winding 101A.

As further illustrated in FIG. 6, the amplifier control unit 605 comprises: An input unit 605A for receiving the input signal 106 and having an analog to digital converter for converting the input signal 106 to a discrete time input signal x[n]

$$x=\{x[n]\},\ 0<n<\infty;$$

wherein the sampling frequency of the discrete time input signal x[n] is according to the switching frequency of the switching units 602 and the controllable diodes unit 104, therefore, each x[n] is corresponding to instantaneous amplitude of the input signal which corresponding to energy to be delivered at each switching; A signal processing unit 605B for transforming the discrete time input signal x[n] to a discrete time peak current signal $I_p[n]$ according to the followings:

$$I_p[n] = 2\sqrt{\frac{x[n]}{x_{max}}} \times I_{pmax}\ \ 0 < n < \infty;$$

wherein $x_{max}$ is the maximum value of the discrete time input signal and $I_{pmax}$ is the maximum value of peak current in the primary winding 101A at the end of the switched on period corresponding to $x_{max}$, wherein the $x_{max}$ and $I_{pmax}$ are all design parameters of the switching amplifier 600. Since the input signal 106 has first and second polarities, therefore, the discrete time peak current signal $I_p[n]$ also has first and second polarities;

A switching control unit 605C coupled to the switches 602A and 602B of the switching unit 602 and the switches 104A and 104B of the controllable diodes unit 104 to control their switching according to the discrete time peak current signal $I_p[n]$ and the negative feedback current signal 118 corresponding to the current through the primary winding 101A. When the input signal 106 is zero, the switches 602A and 602B of the switching unit 602 and the switches 104A and 104B of the controllable diodes unit 104 are all switched off. When the input signal 106 is not zero, the switches 602A and 602B switch the current from the direct current (DC) voltage 103 to the primary winding 101A according to the discrete time peak current signal $I_p[n]$ and the negative feedback current signal 118, for example, at start of each switching, for that the polarity of $I_p[n]$ is positive therefore the switch 104A is switched on and the switch 104B is switched off, the switching control unit 605C switches on the switch 602A and compares the discrete time peak current signal $I_p[n]$ to the negative feedback current signal 118. When the negative feedback current signal 118 reaches $I_p[n]$, the switching control unit 605C switches off the switch 602A and waits for next switching start. For that the polarity of $I_p[n]$ is negative therefore the switch 104A is switched off and the switch 104B is switched on, the switching control unit 605C switches the switches 602B according to the discrete time peak current signal $I_p[n]$ and the negative feedback current signal 118, respectively.

As further illustrated in FIG. 6, the filter unit 107 is a low pass filter to obtain the output signal 108 corresponding to the input signal 106 by filtering the output of the controllable diodes unit 104 and outputting the output signal 108.

As further illustrated in FIG. 6, the switching amplifier 600 further comprising one slave output unit 109 or more than one slave output units, although more than one slave output units are not shown in FIG. 6 but are obvious from said one slave output unit 109, wherein the slave output unit 109 comprises: the transformer 101 further comprising a slave secondary winding 109A; a slave controllable diodes unit 109B coupled to the slave secondary winding 109A for blocking a current in the slave secondary winding 109A when the current in the primary winding 101A is switched on by the switching unit, and conducting the current in the slave secondary winding 109A when the current in the primary winding is switched off; a slave filter unit 109C to obtain a slave output signal 110 corresponding to the input signal by filtering the output of the slave controllable diodes unit 109B and outputting the slave output signal 110.

As further illustrated in FIG. 6, the amplifying gain of the output signal 108 is according to the turn ratio between the primary winding 101A and the secondary winding 101B; and the amplifying gain of the slave output signal 110 is according to the turn ratio between the primary winding 101A and the slave secondary winding 109A. Therefore, it is easy for the switching amplifier 600 to obtain a plurality of output signals with different amplifying gains.

As further illustrated in FIG. 6, the switching amplifier 600 further comprises a negative feedback signal generator 111 to generate a negative feedback signal corresponding to the output signal 112, wherein the amplifier control unit 105 integrates the input signal 106 and the negative feedback signal 112.

Figure 7:
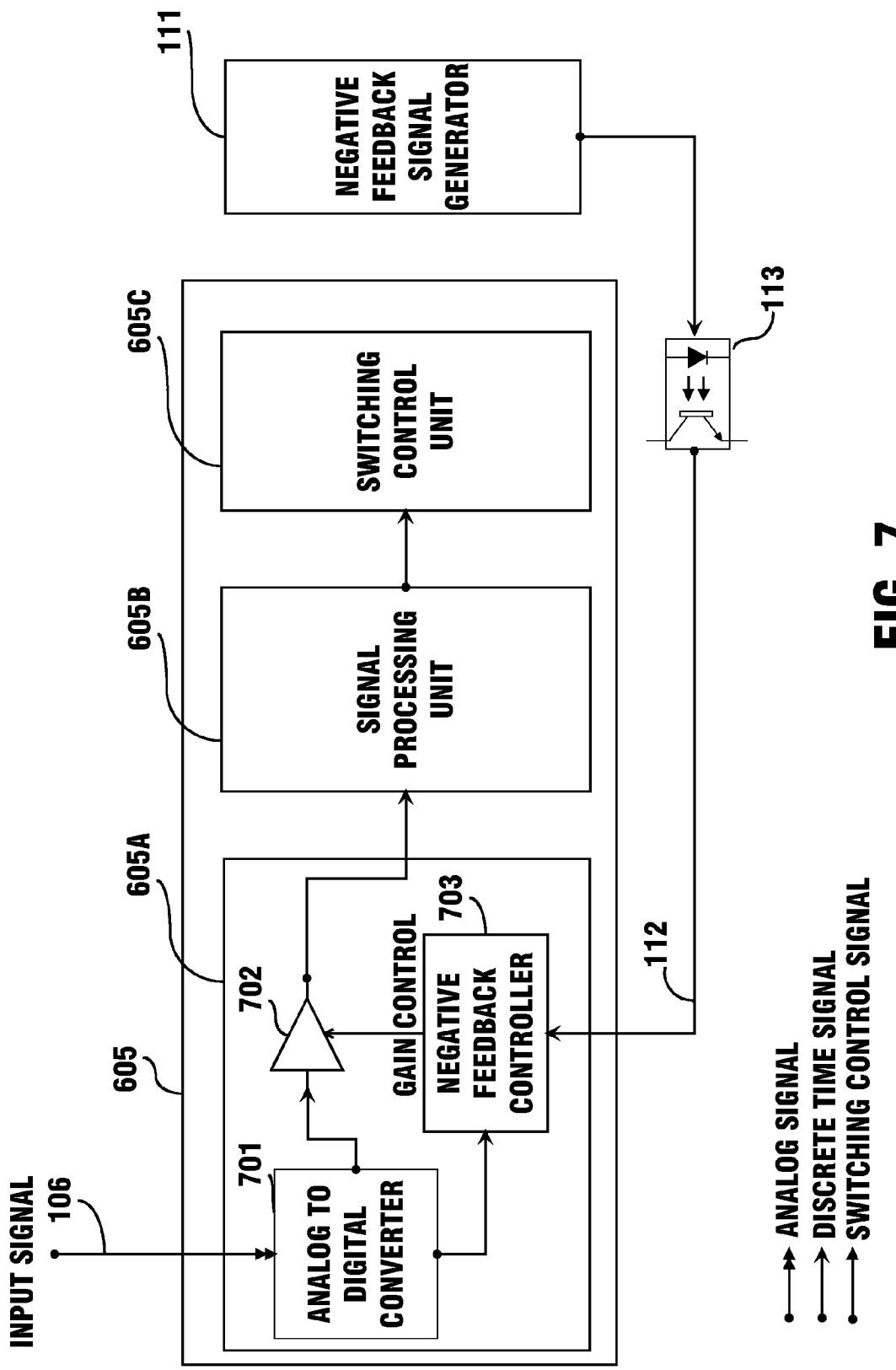
FIG. 7 is an exemplary block and circuit diagram illustrating an embodiment of the amplifier control unit integrating an input signal and a negative feedback signal in FIGS. 6, 8 and 9 in accordance with the present invention.
Figure 8:
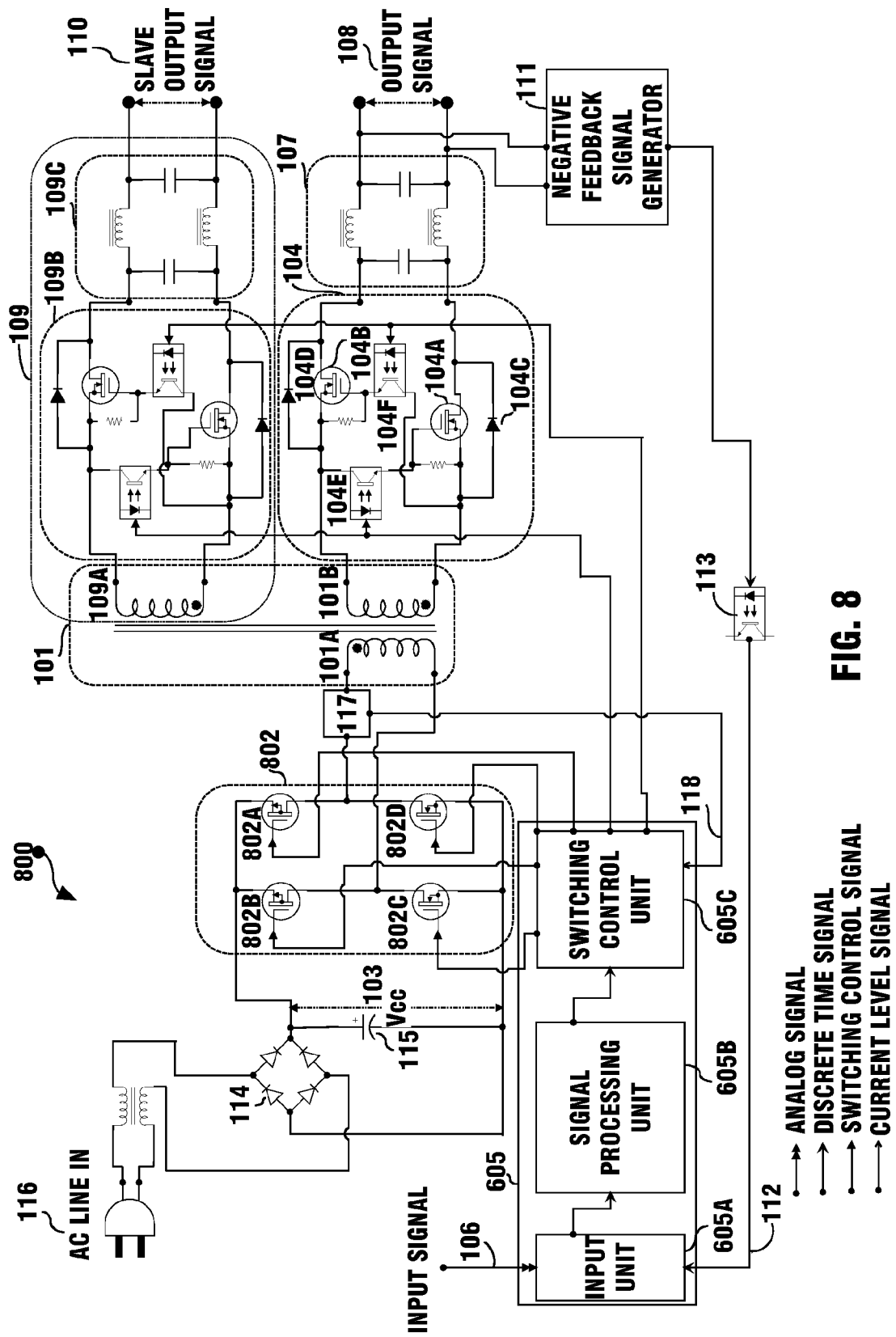
FIG. 8 is an exemplary block and circuit diagram illustrating an embodiment of a switching amplifier in accordance with the second method of present invention, wherein the switching amplifier having switches configured as a full bridge topology.
Figure 9:
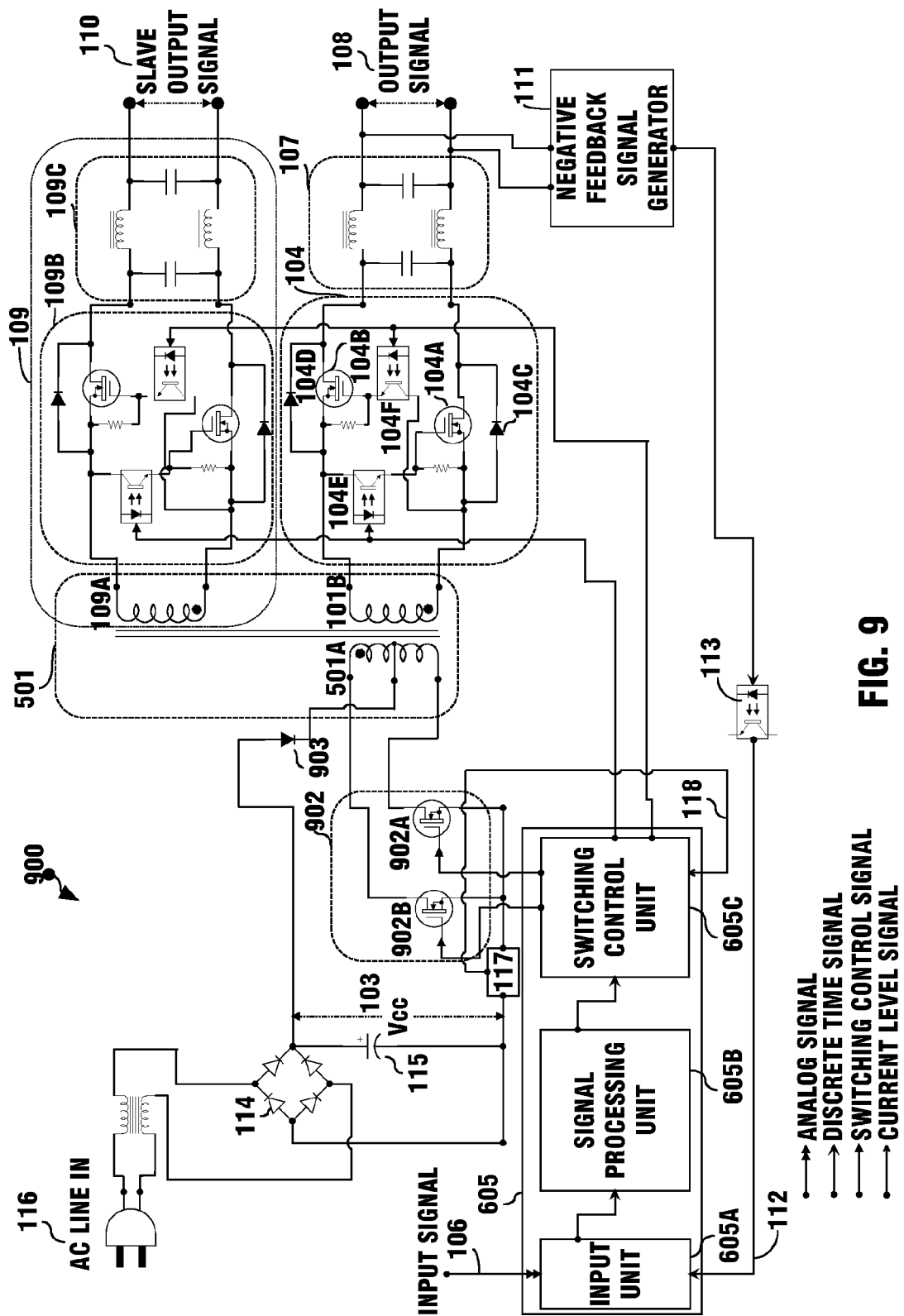
FIG. 9 is an exemplary block and circuit diagram illustrating an embodiment of a switching amplifier in accordance with the second method of present invention, wherein the switching amplifier having switches configured as a push pull topology.

FIG. 7 is an exemplary block and circuit diagram illustrating an embodiment of the amplifier control unit 605 integrating the input signal 106 and a negative feedback signal 112 in FIGS. 6, 8 and 9 in accordance with the present invention.

As illustrated in FIG. 7 and FIG. 6, the input unit 605A has an analog to digital converter 701 and further comprises a linear digital transformer 702 and a negative feedback controller 703. Wherein the analog to digital converter 701 receives the input signal 106 and converts the input signal 106 to a discrete time input signal x[n]:

$$x=\{x[n]\}, 0<n<\infty;$$

The linear digital transformer 702 transforms the discrete time input signal x[n] by multiplying a gain G to the discrete time input signal (the default value of the gain G is 1):

$$Y[n]=\{G \times x[n]\}, 0<n<\infty$$

to get a compensated discrete time signal Y[n] and sends the compensated discrete time signal Y[n] to the signal processing unit 105B.

Accordingly, for the switching amplifier 600 which further comprises the negative feedback signal generator 111 to generate the negative feedback signal 112 corresponding to the output signal 108 and the amplifier control unit 105 further integrating the negative feedback signal 112, the signal processing unit 605B receives the compensated discrete time signal Y[n], and the output of the signal processing unit 605B is:

$$I_p[n] = \sqrt[2]{\frac{Y[n]}{x_{max}}} \times I_{pmax} \quad 0<n<\infty;$$

As further illustrated in FIG. 7, the negative feedback controller 703 receives discrete time input signal from the analog to digital converter 701 and compares it to the negative feedback signal 112, and adjust the gain G of the linear digital transformer 702 according to the comparison. For example, if the negative feedback signal 112 corresponding to the output signal 108 shows that the output signal 108 is below a required level, then the negative feedback controller 703 will increase the gain G of the linear digital transformer 702 to increase the output signal 108, wherein said required level is obtained according to the discrete time input signal.

As further illustrated in FIG. 6, the amplifier control unit 605 of the switching amplifier 600 integrates the input signal 106 and the negative feedback signal 112 to process a negative feedback control. Accordingly, with the negative feedback control, the slave output signal 110 trends to track the output signal 108 for the direct current (DC) voltage 103 and load changes. Therefore, the switching amplifier 600 provides multiple output signals are substantially immune to power supply and load perturbations.

As further illustrated in FIG. 6, the switching amplifier 600 further comprises a photo coupler 113 coupled between the negative feedback signal generator 111 and the amplifier control unit 605 to provide electric isolation between the negative feedback signal generator 111 and the amplifier control unit 605.

As further illustrated in FIG. 6, the switching amplifier 600 further comprises a rectifying unit 114 and a smoothing unit 115 to rectify and smooth an alternating current (AC) voltage 116 and to provide the direct current (DC) voltage 103, wherein the rectifying unit 114 is a full bridge rectifier and the smoothing unit 115 is a capacitor.

FIG. 8 is an exemplary block and circuit diagram illustrating an embodiment of a switching amplifier 800 in accordance with the second method of present invention, wherein the switching amplifier 800 having switches 802A, 802B, 802C and 802D configured as a full bridge topology.

As illustrated in FIG. 8, the switching amplifier 800 of the present invention for amplifying an input signal 106 having positive and negative polarities is comprised of: a transformer 101 comprising a primary winding 101A and a secondary winding 101B magnetically coupled to the primary winding 101A; a switching unit 802 comprising four switches 802A, 802B, 802C and 802D configured as a full bridge topology coupled to the primary winding 101A for switching a current in the primary winding 101A from a direct current (DC) voltage 103; a controllable diodes unit 104 coupled to the secondary winding 101B; a negative feedback current signal generator 117 to generate a negative feedback current signal 118 corresponding to the current of the primary winding; an amplifier control unit 105 for receiving the input signal 106, the negative feedback current signal 118 and coupled to the switches 802A, 802B, 802C and 802D of the switching unit 802 and the switches 104A and 104B of the controllable diodes unit 104 through photo couplers 104E and 104F respectively for controlling their switching according to the input signal 106 and the negative feedback current signal 118; a filter unit 107 coupled to the controllable diodes unit 104.

In this non-limiting exemplary embodiment, the input signal 106 is an analog signal. However, a corresponding embodiment of a switching amplifier in accordance with this invention for an input signal which is a discrete time signal is obvious.

As further illustrated in FIG. 8, the transformer 101 is a flyback transformer operated in discontinuous mode. Accordingly, when the current in the primary winding 101A is switched on, the current in the secondary winding 101B is blocked by the controllable diodes unit 104. Therefore, during this switched on period, the primary winding acts like a pure inductor and the current in the primary winding 101A builds up linearly in it from zero to a peak value. Further, when the current in the primary winding 101A is switched off, the current in the secondary winding 101B is conducted by the controllable diodes unit 104 for delivering previously stored energy to the filter unit 107.

As further illustrated in FIG. 8, the amplifier control unit 605 comprises an input unit 605A for receiving the input signal 106 and converting the input signal 106 to a discrete time input signal x[n], wherein the sampling frequency of the discrete time input signal x[n] is according to the switching frequency of the switching unit 802 and the controllable diodes unit 104; a signal processing unit 605B for transforming the discrete time input signal and outputting a discrete time peak current signal $I_p[n]$, as previously illustrated in FIG. 6; and a switching control unit 605C coupled to the switching unit 802 and the controllable diodes unit 104 to control their switching.

As illustrated in FIG. 8, the switching control unit 605C coupled to the switches 802A, 802B, 802C and 802D of the switching unit 802 and the switches 104A and 104B of the controllable diodes unit 104 to control their switching according to the discrete time peak current signal $I_p[n]$ and a negative feedback current signal 118 corresponding to the current in the primary winding 101A. When the input signal 106 is zero, the switches 802A, 802B, 802C and 802D of the switching unit 802 and the switches 104A and 104B of the controllable diodes unit 104 are all switched off. When the input signal 106 is not zero, the switches 802A, 802B, 802C and 802D switch the current from the direct current (DC) voltage 103 to the primary winding 101A according to the discrete time peak current signal $I_p[n]$ and the negative feedback current signal 118, for example, at start of each switching, for that the polarity of $I_p[n]$ is positive therefore the switch 104A is switched on and the switch 104B is switched off, the switching control unit 605C switches on the switch 802A and 802C, and compares the discrete time peak current signal $I_p[n]$ to the negative feedback current signal 118. When the negative feedback current signal 118 reaches $I_p[n]$, the switching control unit 605C switches off the switches 802A, 802C and waits for next switching start. For that the polarity of $I_p[n]$ is negative therefore the switch 104A is switched off and the switch 104B is switched on, the switching control unit 605C switches the switches 802B and 802D according to the discrete time peak current signal $I_p[n]$ and the negative feedback current signal 118, respectively.

As further illustrated in FIG. 8, the filter unit 107 is a low pass filter to obtain the output signal 108 corresponding to the input signal 106 by filtering the output of the controllable diodes unit 104 and outputting the output signal 108.

As further illustrated in FIG. 8, the switching amplifier 800 further comprising one slave output unit 109 or more than one slave output units, as previously illustrated in FIG. 6.

As further illustrated in FIG. 8, the switching amplifier 800 further comprises a negative feedback signal generator 111 to generate a negative feedback signal corresponding to the output signal 112, wherein the amplifier control unit 105 integrates the input signal 106 and the negative feedback signal 112.

As further illustrated in FIG. 8, the amplifier control unit 105 of the switching amplifier 800 integrates the input signal 106 and the negative feedback signal 112 to process a negative feedback control. Accordingly, with the negative feedback control, the slave output signal 110 trends to track the output signal 108 for the direct current (DC) voltage 103 and load changes. Therefore, the switching amplifier 800 provides multiple output signals are substantially immune to power supply and load perturbations.

As further illustrated in FIG. 8, the switching amplifier 800 further comprises a photo coupler 113 coupled between the negative feedback signal generator 111 and the amplifier control unit 105 to provide electric isolation between the negative feedback signal generator 111 and the amplifier control unit 105.

As further illustrated in FIG. 8, the switching amplifier 800 further comprises a rectifying unit 114 and a smoothing unit 115 to rectify and smooth an alternating current (AC) voltage 116 and to provide the direct current (DC) voltage 103.

FIG. 9 is an exemplary block and circuit diagram illustrating an embodiment of a switching amplifier 900 in accordance with the second method of present invention, wherein the switching amplifier 900 having switches 902A and 902B configured as a push pull topology.

As illustrated in FIG. 9, the switching amplifier 900 of the present invention for amplifying an input signal 106 having positive and negative polarities is comprised of: a transformer 501 comprising a primary winding 501A and a secondary winding 101B magnetically coupled to the primary winding 501A; a switching unit 902 comprising two switches 902A and 902B and configured as a push pull topology coupled to the primary winding 501A for switching a current in the primary winding 501A from a direct current (DC) voltage 103; a diode 903 for preventing a current flow from the primary winding 501A to the direct current (DC) voltage 103; a controllable diodes unit 104 coupled to the secondary winding 101B; a negative feedback current signal generator 117 to generate a negative feedback current signal 118 corresponding to the current of the primary winding; an amplifier control unit 605 for receiving the input signal 106, the negative feedback current signal 118 and coupled to the switches 902A and 902B of the switching unit 902 and the switches 104A and 104B of the controllable diodes unit 104 through photo couplers 104E and 104F respectively for controlling their switching; a filter unit 107 coupled to the controllable diodes unit 104.

In this non-limiting exemplary embodiment, the input signal 106 is an analog signal. However, a corresponding embodiment of a switching amplifier in accordance with this invention for an input signal which is a discrete time signal is obvious.

As further illustrated in FIG. 9, the transformer 501 is a flyback transformer operated in discontinuous mode. Accordingly, when the current in the primary winding 501A is switched on, the current in the secondary winding 101B is blocked by the controllable diodes unit 104. Therefore, during this switched on period, the primary winding acts like a pure inductor and the current in the primary winding 501A builds up linearly in it from zero to a peak value. Further, when the current in the primary winding 501A is switched off, the current in the secondary winding 101B is conducted by the controllable diodes unit 104 for delivering previously stored energy to the filter unit 107.

As further illustrated in FIG. 9, the amplifier control unit 605 comprises an input unit 605A for receiving the input signal 106 and converting the input signal 106 to a discrete time input signal x[n], wherein the sampling frequency of the discrete time input signal x[n] is according to the switching frequency of the switching unit 902 and the controllable diodes unit 104; a signal processing unit 605B for transforming the discrete time input signal and outputting a discrete time peak current signal $I_p[n]$, as previously illustrated in FIG. 6; and a switching control unit 605C coupled to the switching unit 902 and the controllable diodes unit 104 to control their switching.

As illustrated in FIG. 9, the switching control unit 605C coupled to the switches 902A, 902B of the switching unit 902 and the switches 104A and 104B of the controllable diodes unit 104 to control their switching according to the discrete time peak current signal $I_p[n]$ and a negative feedback current signal 118 corresponding to the current in the primary winding 501A. When the input signal 106 is zero, the switches 902A, 902B of the switching unit 902 and the switches 104A and 104B of the controllable diodes unit 104 are all switched off. When the input signal 106 is not zero, the switches 902A, 902B switch the current from the direct current (DC) voltage 103 to the primary winding 501A according to the discrete time peak current signal $I_p[n]$ and the negative feedback current signal 118, for example, at start of each switching, for that the polarity of $I_p[n]$ is positive therefore the switch 104A is switched on and the switch 104B is switched off, the switching control unit 605C switches on the switch 902A and compares the discrete time peak current signal $I_p[n]$ to the negative feedback current signal 118. When the negative feedback current signal 118 reaches $I_p[n]$, the switching control unit 605C switches off the switches 902A and waits for next switching start. For that the polarity of $I_p[n]$ is negative therefore the switch 104A is switched off and the switch 104B is switched on, the switching control unit 605C switches the switches 902B according to the discrete time peak current signal $I_p[n]$ and the negative feedback current signal 118, respectively.

As further illustrated in FIG. 9, the filter unit 107 is a low pass filter to obtain the output signal 108 corresponding to the input signal 106 by filtering the output of the controllable diodes unit 104 and outputting the output signal 108.

As further illustrated in FIG. 9, the switching amplifier 900 further comprising one slave output unit 109 or more than one slave output units, as previously illustrated in FIG. 6.

As further illustrated in FIG. 9, the switching amplifier 900 further comprises a negative feedback signal generator 111 to generate a negative feedback signal corresponding to the output signal 112, wherein the amplifier control unit 605 integrates the input signal 106 and the negative feedback signal 112.

As further illustrated in FIG. 9, the amplifier control unit 605 of the switching amplifier 900 integrates the input signal 106 and the negative feedback signal 112 to process a negative feedback control. Accordingly, with the negative feedback control, the slave output signal 110 trends to track the output signal 108 for the direct current (DC) voltage 103 and load changes. Therefore, the switching amplifier 900 provides multiple output signals are substantially immune to power supply and load perturbations.

As further illustrated in FIG. 9, the switching amplifier 900 further comprises a photo coupler 113 coupled between the negative feedback signal generator 111 and the amplifier control unit 605 to provide electric isolation between the negative feedback signal generator 111 and the amplifier control unit 605.

As further illustrated in FIG. 9, the switching amplifier 900 further comprises a rectifying unit 114 and a smoothing unit 115 to rectify and smooth an alternating current (AC) voltage 116 and to provide the direct current (DC) voltage 103.

Figure 10:
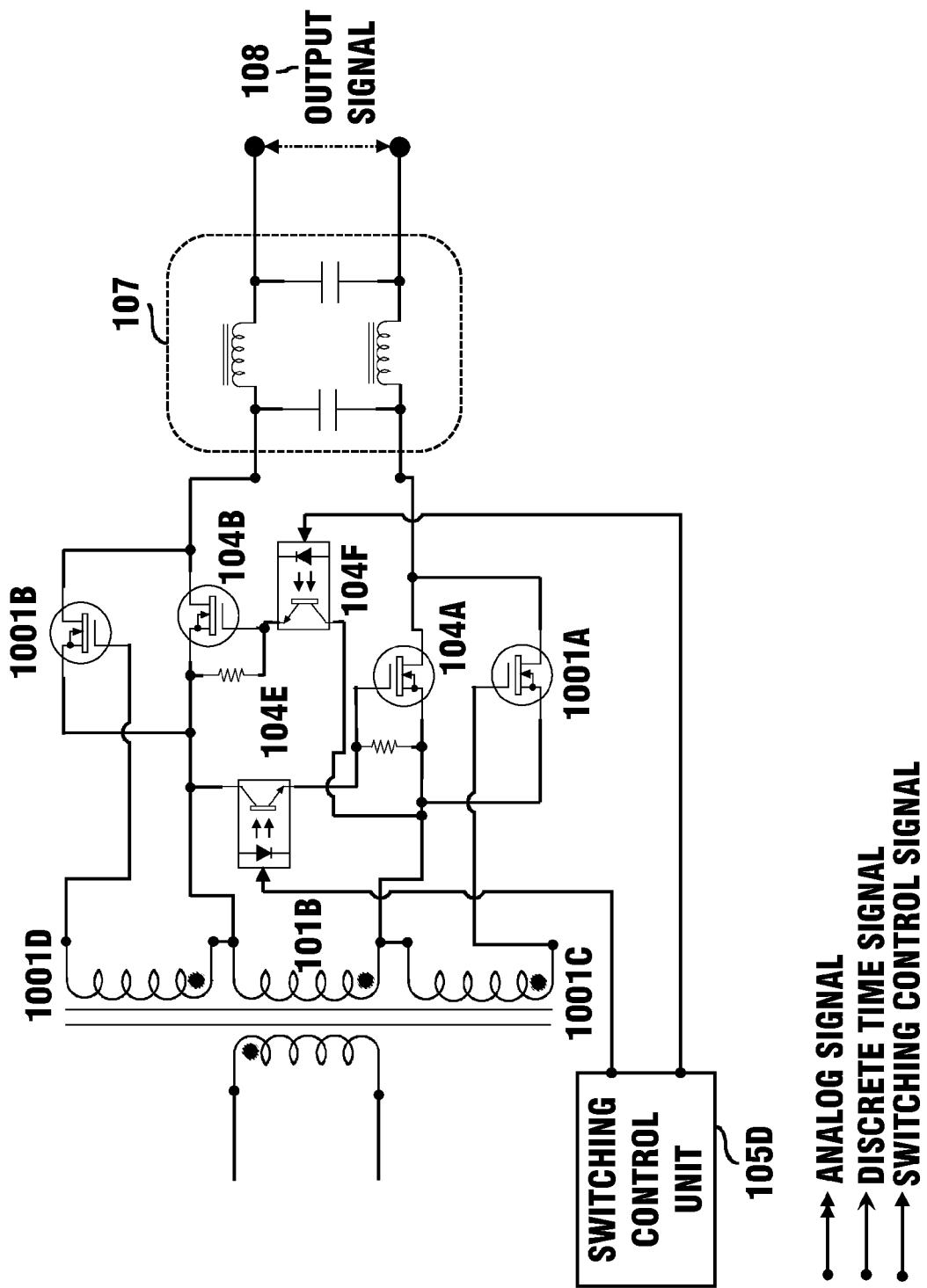
FIG. 10 is an exemplary block and circuit diagram illustrating an embodiment of the controllable diodes unit in FIGS. 1, 4, 5, 6, 8 and 9 in accordance with the present invention, wherein the diode means of the controllable diodes unit are synchronous switches.

FIG. 10 is an exemplary block and circuit diagram illustrating an embodiment of the controllable diodes unit in FIGS. 1, 4, 5, 6, 8 and 9 in accordance with the present invention, wherein the diode means of the controllable diodes unit are synchronous switches.

As illustrated in FIG. 10, the diodes means 104C and 104D of the controllable diodes unit 104 in the FIGS. 1, 4, 5, 6, 8 and 9 can be replaced by the synchronous switches 1001A and 1001B respectively. Also, the diodes means of the slave controllable diodes unit 109B in the FIGS. 1, 4, 5, 6, 8 and 9 can be replaced by synchronous switches, either. The replacement is for better power efficiency by eliminating the power consumed in the diode means. However, in contrary, a synchronous switch is generally a little more expansive than a diode means.

Figure 11:
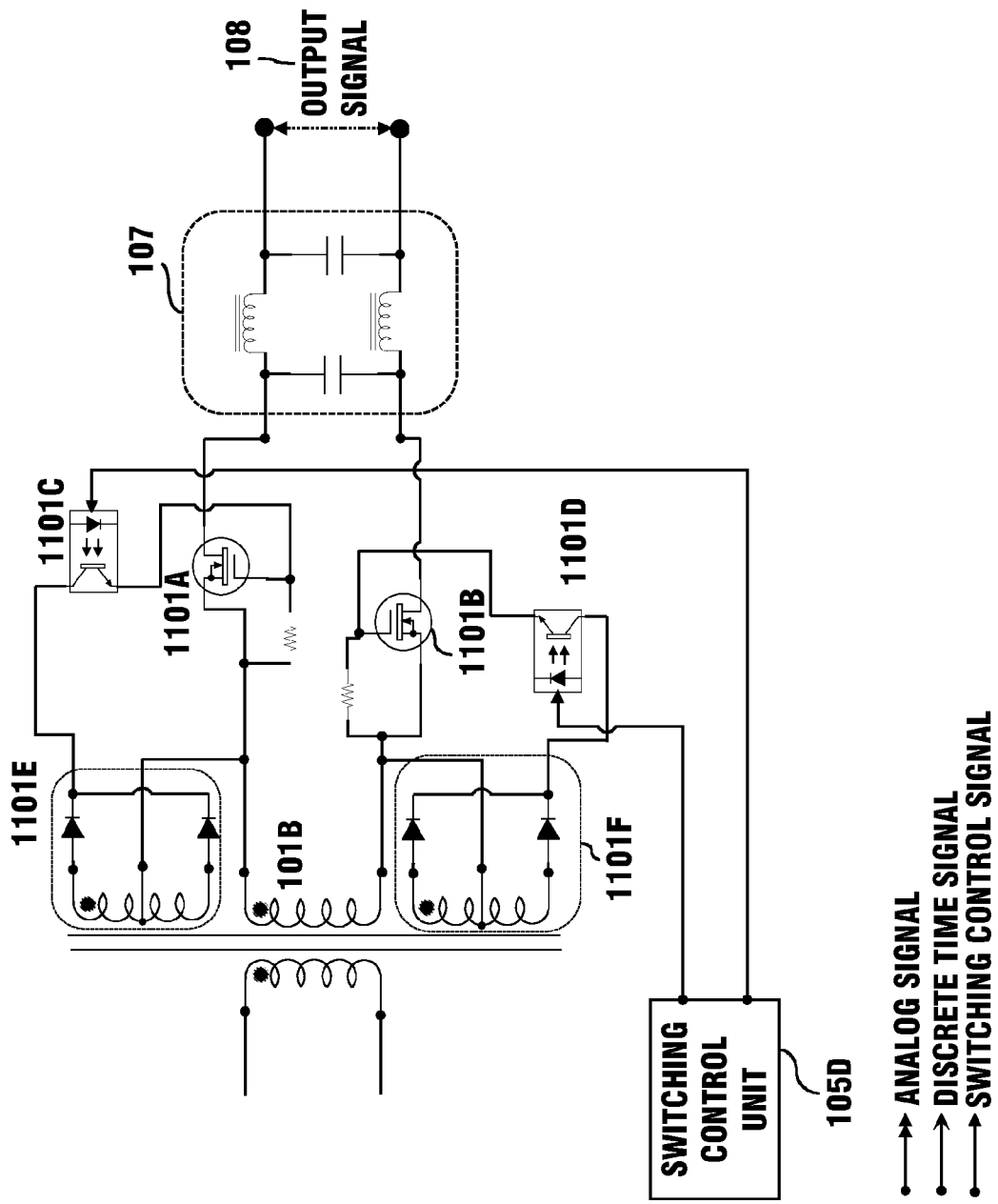
FIG. 11 is an exemplary block and circuit diagram illustrating an embodiment of the controllable diodes unit in FIGS. 1, 4, 5, 6, 8 and 9 in accordance with the present invention, wherein the controllable diodes unit comprises two switches.

FIG. 11 is an exemplary block and circuit diagram illustrating an embodiment of the controllable diodes unit in FIGS. 1, 4, 5, 6, 8 and 9 in accordance with the present invention, wherein the controllable diodes unit comprises two switches 1101A and 1101B, two photo couplers 1101C and 1101D, and two windings 1101E and 1101F of the transformer 101 for providing bias voltages to the gate of the switches 1101A and 1101B.

As illustrated in FIGS. 11, 1 and 2, for the controllable diodes unit 104 in the FIG. 1 is replaced by the switches 1101A and 1101B, the photo couplers 1101C and 1101D, and the windings 1101E and 1101F, a non-limiting exemplary waveform for the pulse modulated signal outputting from the pulse modulation unit 105C is illustrated in FIG. 2(A). According to the pulse modulated signal illustrated in FIG. 2(A), non-limiting exemplary waveforms of switching control signals from the switching control unit 105D to the switches 102A and 102B for controlling their switching are illustrated in FIG. 2(B) and FIG. 2(C), respectively. Also according to the pulse modulated signal illustrated in FIG. 2(A), non-limiting exemplary waveforms of switching control signals from the switching control unit 105D to the switches 1101A and 1101B through photo couplers 1101C and 1101D respectively are illustrated in FIG. 2(F) and FIG. 2(G), respectively.

As further illustrated in FIG. 11 and FIGS. 1, 4, 5, 6, 8 and 9 the controllable diodes unit 104 or the slave controllable diodes unit 109B in the FIGS. 1, 4, 5, 6, 8 and 9 can be replaced by the circuit comprising the switches 1101A and 1101B, the photo couplers 1101C and 1101D, and the windings 1101E and 1101F of the transformer 101 for better power efficiency by eliminating power consumed in the diode means of the controllable diodes unit 104 or the slave controllable diodes unit 109B and for the saving of using less switches. However, as shown in FIG. 2(F) and FIG. 2(G), comparing to the controllable diodes unit 104, the switching of the switches 1101A and 1101B are a little more complex.

From the switching amplifiers 100, 400, 500, 600, 800 and 900 in accordance with the present invention, one aspect of the present invention provides a switching amplifier that is highly efficient and without the "dead time" problem related to the class D amplifiers. Accordingly, the switches of the switching amplifiers 100, 400, 500, 600, 800 and 900 are never short the direct current (DC) voltage 103 through themselves.

From the switching amplifiers 100, 400, 500, 600, 800 and 900 in accordance with the present invention, another aspect of the present invention provides a switching amplifier that is completely off when there is no input signal.

From the switching amplifiers 100, 400, 500, 600, 800 and 900 in accordance with the present invention, yet another aspect of the present invention provides a switching amplifier for obtaining a plurality of different linearly amplified replicas of the input signal, and adding more outputs easily and economically.

From the switching amplifiers 100, 400, 500, 600, 800 and 900 in accordance with the present invention, yet another aspect of the present invention provides a switching amplifier that isolates the outputs from the power supply.

From the switching amplifiers 100, 400, 500, 600, 800 and 900 in accordance with the present invention, yet another aspect of the present invention provides a switching amplifier which comprised of an act of comparing an input signal with an output feedback signal for detection and correction of overall system signal processes therefore does not require a power supply regulator and is substantially immune to power supply and load perturbations.

From the switching amplifiers 100, 400, 500, 600, 800 and 900 in accordance with the present invention, yet another aspect of the present invention provides a switching amplifier with the negative feedback control that the slave output signals trends to track the output signal for the direct current (DC) voltage and load changes for obtaining multiple output signals are substantially immune to power supply and load perturbations.

It is to be understood that the above described embodiments are merely illustrative of the principles of the invention and that other arrangements may be devised by those skilled in the art without departing from the spirit and scope of the invention.

What is claimed is:

1. A method of obtaining one or more than one output signals from a direct current (DC) voltage, wherein the output signals are linearly amplified replicas of an input signal, comprising the steps of:

receiving the input signal;

transforming and pulse modulating the input signal for generating a pulse modulated signal, wherein the transforming is based on that when applying the direct current (DC) voltage across a primary winding of a flyback transformer, the energy stored in the primary winding is proportional to square of the applying time, wherein the flyback transformer further comprises one or more than one secondary windings that each secondary winding is for generating a corresponding output signal;

switching a current in the primary winding from the direct current (DC) voltage according to the pulse modulated signal;

generating the output signals comprising the following steps for each output signal from its corresponding secondary winding:

blocking a current in the corresponding secondary winding when the current in the primary winding is switched on and conducting the current when the current in the primary winding is switched off for generating a pulsed output signal;

filtering the pulsed output signal for outputting the output signal.

2. The method of claim 1 further comprising:

getting a feedback signal by detecting one of the output signals and integrating the feedback signal to process a negative feedback control.

3. A method of obtaining one or more than one output signals from a direct current (DC) voltage, wherein the output signals are linearly amplified replicas of an input signal having first and second polarities, comprising the steps of:

receiving the input signal;

transforming the input signal for generating a discrete time peak current signal, wherein said transforming is according to that when applying the direct current (DC) voltage across a primary winding of a flyback transformer, the energy stored in the primary winding is proportional to square of the peak current of the primary winding, wherein the flyback transformer further comprises one or more than one secondary windings that each secondary winding is for generating a corresponding output signal;

switching a current in the primary winding from the direct current (DC) voltage and getting a feedback current signal by detecting the current of the primary winding, wherein said switching is according to the discrete time peak current signal and the feedback current signal;

generating the output signals comprising the following steps for each output signal from its corresponding secondary winding:

blocking a current in the corresponding secondary winding when the current in the primary winding is switched on and conducting the current when the current in the primary winding is switched off for generating a pulsed output signal;

filtering the pulsed output signal for outputting the output signal.

4. The method of claim 3 further comprising:

getting a feedback signal by detecting one of the output signals and integrating the feedback signal to process a negative feedback control.

5. A switching amplifier for amplifying an input signal having first and second polarities, said amplifier comprising:

a flyback transformer comprising a primary winding and a secondary winding;

a switching unit coupled to the primary winding for switching a current in the primary winding from a direct current (DC) voltage;

a controllable diodes unit coupled to the secondary winding for blocking a current in the secondary winding when the current in the primary winding is switched on by the switching unit, and conducting the current in the secondary winding when the current in the primary winding is switched off;

an amplifier control unit for receiving the input signal and coupled to the switching unit and the controllable diodes unit to control their switching according to the input signal;

a filter unit to obtain an output signal corresponding to the input signal by filtering the output of the controllable diodes unit and outputting the output signal.

6. The switching amplifier according to claim 5, further comprising one or more than one slave output units to obtain one or more than one slave output signals, wherein each slave output unit comprises:

the flyback transformer further comprising a slave secondary winding;

a slave controllable diodes unit coupled to the slave secondary winding for blocking a current in the slave secondary winding when the current in the primary winding is switched on by the switching unit, and conducting the current in the slave secondary winding when the current in the primary winding is switched off;

a slave filter unit to obtain a slave output signal corresponding to the input signal by filtering the output of the slave controllable diodes unit and outputting the slave output signal.

7. The switching amplifier according to claim 5, further comprising:

a negative feedback current signal generator to generate a negative feedback current signal corresponding to the current of the primary winding of the flyback transformer, wherein the amplifier control unit integrates the input signal and the negative feedback current signal to process a negative feedback control.

8. The switching amplifier according to claim 5, further comprising:

a negative feedback signal generator to generate a negative feedback signal corresponding to the output signal, wherein the amplifier control unit integrates the input signal and the negative feedback signal to process a negative feedback control.

9. The switching amplifier according to claim 7, further comprising:

an isolator circuit coupled between the negative feedback signal generator and the amplifier control unit to provide electric isolation between the negative feedback signal generator and the amplifier control unit.

10. The switching amplifier according to claim 5, further comprising:

a rectifying and smoothing unit to rectify and smooth an alternating current (AC) voltage and to provide the direct current (DC) voltage.

11. The switching amplifier according to claim 5, further comprising:
   isolator circuits coupled between the switching unit and the amplifier control unit to provide electric isolation between the switching unit and the amplifier control unit.

12. The switching amplifier according to claim 6, further comprising:
   isolator circuits coupled between the controllable diodes unit and the amplifier control unit to provide electric isolation between the controllable diodes unit and the amplifier control unit;
   isolator circuits coupled between the slave controllable diodes units and the amplifier control unit to provide electric isolation between the slave controllable diodes units and the amplifier control unit.

13. The switching amplifier according to claim 5, wherein the switching unit comprises a plurality of switches configured as a half bridge topology.

14. The switching amplifier according to claim 5, wherein the switching unit comprises a plurality of switches configured as a full bridge topology.

15. The switching amplifier according to claim 5, wherein the switching unit comprises a plurality of switches configured as a push pull topology.

16. The switching amplifier according to claim 6, wherein the controllable diodes unit or said each slave controllable diodes unit comprises two switches and two diode means, wherein said diode means is a diode or a synchronous switch.

17. The switching amplifier according to claim 6, wherein the controllable diodes unit or said each slave controllable diodes unit comprises two switches.

18. The switching amplifier according to claim 6, wherein the filter unit or the slave filter unit is a low pass filter.

19. The switching amplifier according to claim 6, wherein the filter unit or the slave filter unit is a band pass filter.

20. The switching amplifier according to claim 6, wherein the filter unit or the slave filter unit is a band stop filter.

* * * * *